(12) United States Patent
Nerreter

(10) Patent No.: US 8,373,417 B2
(45) Date of Patent: Feb. 12, 2013

(54) METHOD AND DEVICE TO DETECT FAILURE OF A MAGNETIC RESONANCE GRADIENT COIL BY MONITORING A SUPPLY CABLE THEREOF

(75) Inventor: Ulrich Nerreter, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 372 days.

(21) Appl. No.: 12/793,907

(22) Filed: Jun. 4, 2010

(65) Prior Publication Data
US 2010/0308840 A1    Dec. 9, 2010

(30) Foreign Application Priority Data

Jun. 5, 2009  (DE) .......................... 10 2009 024 078

(51) Int. Cl.
*G01V 3/00* (2006.01)
(52) U.S. Cl. ........................................ 324/322; 324/318
(58) Field of Classification Search .................. 324/322, 324/318, 314, 312, 309, 307, 300
See application file for complete search history.

(56) References Cited

U.S. PATENT DOCUMENTS

| | | | | |
|---|---|---|---|---|
| 5,237,277 A | * | 8/1993 | Lenz | 324/322 |
| 5,394,086 A | | 2/1995 | Patrick et al. | |
| 5,726,571 A | * | 3/1998 | Guclu et al. | 324/322 |
| 6,909,977 B2 | * | 6/2005 | Orton | 702/65 |
| 6,943,551 B2 | | 9/2005 | Eberler et al. | |
| 7,626,385 B2 | * | 12/2009 | Yokoi et al. | 324/307 |

FOREIGN PATENT DOCUMENTS

| | | |
|---|---|---|
| DE | 239 689 A1 | 10/1986 |
| DE | 197 10 742 A1 | 9/1998 |

* cited by examiner

*Primary Examiner* — Louis Arana
(74) *Attorney, Agent, or Firm* — Schiff Hardin LLP

(57) ABSTRACT

Efficient gradient cable monitoring is enabled by a device and a method to determine a failure in at least one gradient coil of a magnetic resonance tomography system with gradient cables supplying current thereto, wherein the difference of at least one electrical current flowing through a gradient cable to a gradient coil and at least one electrical current flowing through a gradient cable away from a gradient coil is determined. A failure of a gradient cable is assumed if the absolute value of the difference exceeds a limit value.

24 Claims, 5 Drawing Sheets

Error current detection with individual inductors

Gradient system (one axis)

Error current detection with individual inductors

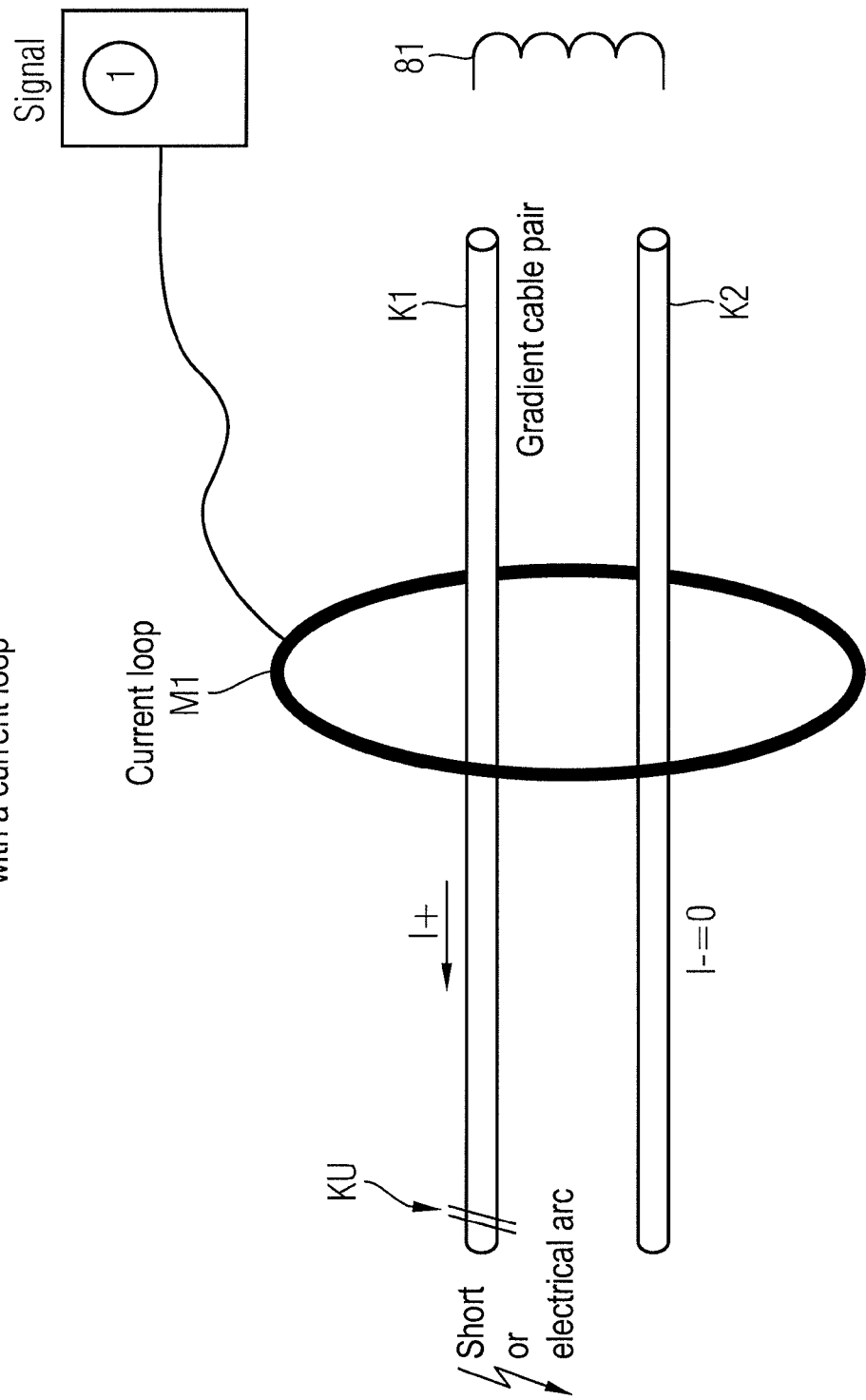

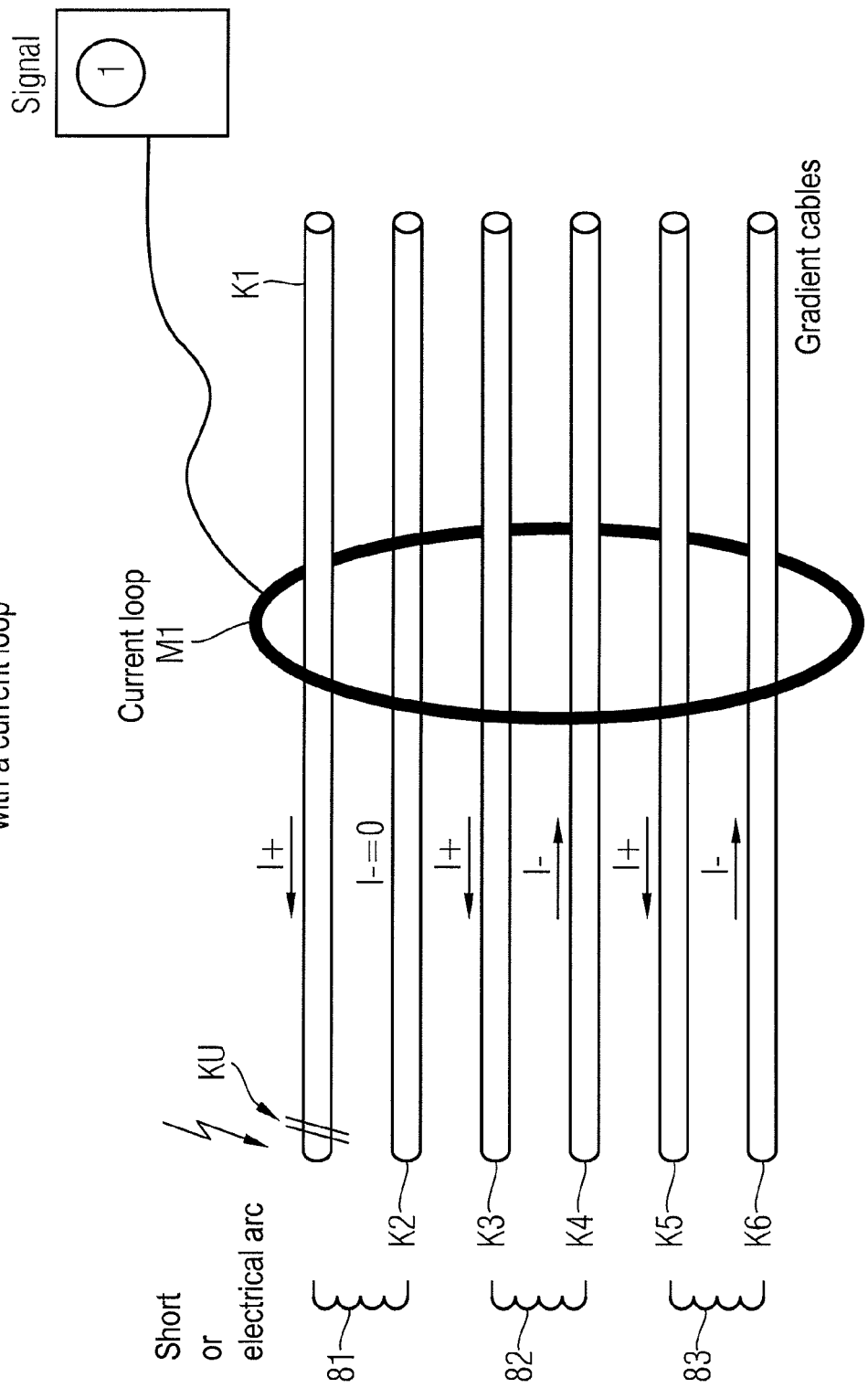

METHOD AND DEVICE TO DETECT FAILURE OF A MAGNETIC RESONANCE GRADIENT COIL BY MONITORING A SUPPLY CABLE THEREOF

BACKGROUND OF THE INVENTION

1. Field of the Invention

The present invention concerns a method and device to determine a failure in at least one gradient coil of a magnetic resonance tomography system with current-supplying gradient cables.

2. Description of the Prior Art

Magnetic resonance apparatuses to examine patients by magnetic resonance tomography (MR) in particular are known from DE 103 14 215, for example.

Modern magnetic resonance systems operate with coils that emit radio-frequency pulses to excite nuclear spins so as to emit magnetic resonance signals and/or to receive the induced magnetic resonance signals. A magnetic resonance system typically has a permanent magnet or (more often) a superconducting coil to generate an optimally homogeneous magnetic field—known as a basic magnetic field (HO)—in an examination region. A magnetic resonance system also typically has a large coil that is normally permanently installed in the MR apparatus—known as a whole-body coil (also called a body coil or BC)—and multiple small local coils (also called surface coils or local coil). To acquire information (data) from which images of a patient can be generated, selected regions of the subject or patient to be examined can be read out with gradient coils for three axes (for example X, Y approximately radial to the patient, Z in the longitudinal direction of the patient). The spatial coding in magnetic resonance tomography is typically achieved with the use of a gradient coil system with three independently controllable gradient field coil systems that are magnetically orthogonal to one another. The orientation of the coding plane ('gradient field') can be freely selected by superimposing the three freely scalable fields (in the three directions X, Y, Z).

SUMMARY OF THE INVENTION

An object of the present invention is to provide efficient gradient cable monitoring in a magnetic resonance tomography system in order to detect failure of at least one gradient coil of the gradient coil system.

This object is achieved in accordance with the invention by a method to determine a failure in at least one gradient coil of a magnetic resonance tomography system with current-supplying gradient cables, wherein the difference of at least one electrical current flowing through a gradient cable to a gradient coil and at least one electrical current flowing through a gradient cable away from a gradient coil is determined, and a failure of a gradient cable is assumed if the absolute value of the difference exceeds a limit value.

The invention also encompasses a gradient cable monitoring unit to monitor a gradient coil with current-supplying gradient cables of a magnetic resonance tomography system, that includes a device to determine the difference of at least one electrical current flowing through a gradient cable to a gradient coil and at least one electrical current flowing away from a gradient coil through a gradient cable.

Preferred embodiments of the invention are, for example, error current detection with individual inductors (measurement devices) at each of the gradient cables in normal operation and given a cable break of a gradient cable, error current detection with only one common current loop for two gradient cables of an axis (z), and error current detection with only one common current loop for three axes (x, y, z).

BRIEF DESCRIPTION OF THE DRAWINGS

FIG. 5 schematically illustrates error current detection with only one common current loop for three axes.

DESCRIPTION OF THE PREFERRED EMBODIMENTS

Figure 1:
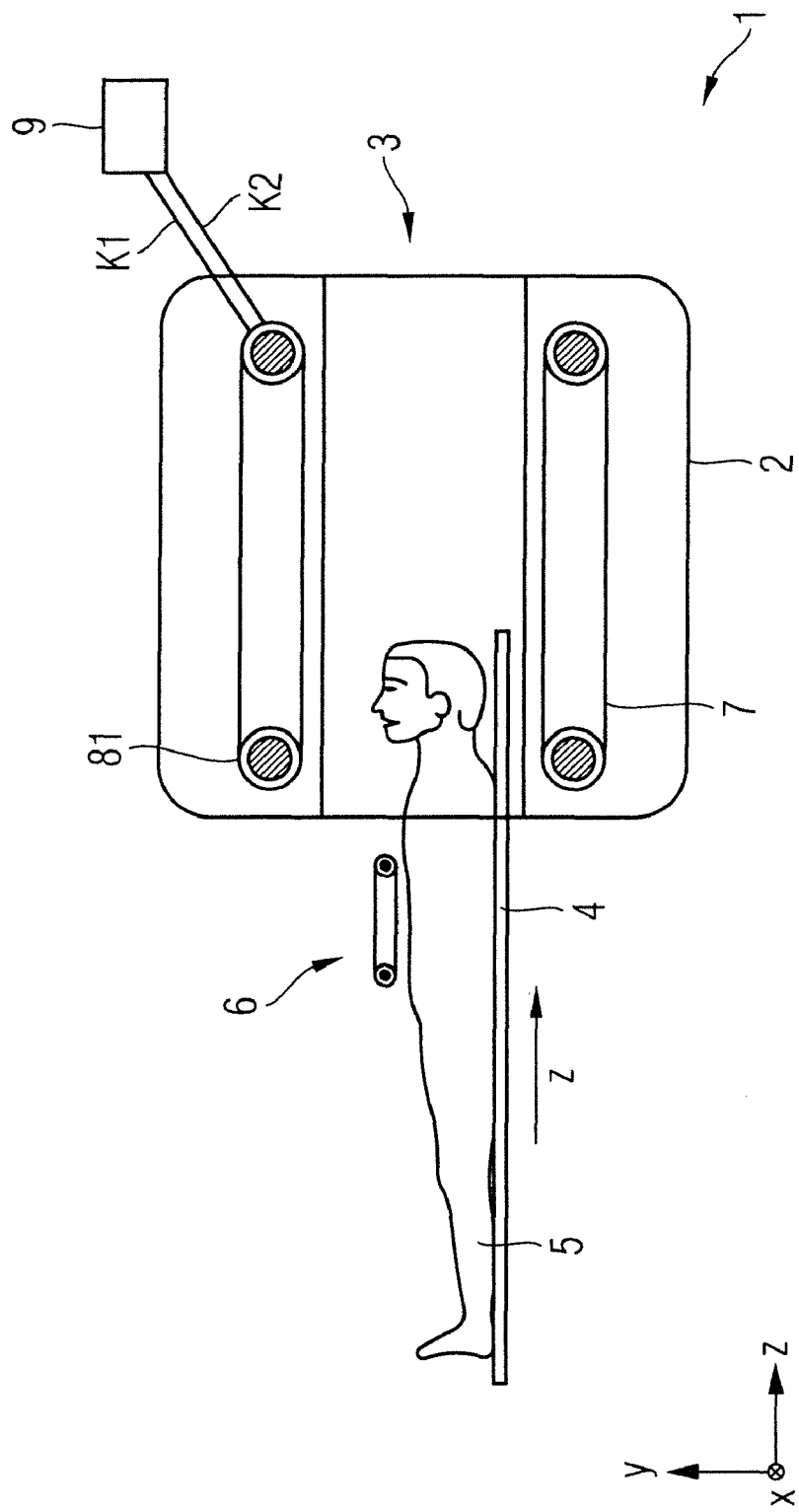
FIG. 1 schematically illustrates an MRT whole-body coil and a local coil whose position is determined.

FIG. 1 schematically shows, in a simplified form, a magnetic resonance apparatus MRT 1 with a whole-body coil 2 with a tube-shaped space 3 into which a patient bed 4 (with a patient 5 and local coil 6, for example) can be moved in order to generate exposures of the patient 5. To acquire information from which images of a patient can be generated, selected regions of the subject or the patient to be examined can be read out with gradient coils for three symbolically depicted axes X, Y, Z (for example X, Y approximately radial to the patient, Z in the longitudinal direction of the patient). The spatial coding in magnetic resonance tomography is typically achieved with the use of a gradient coil system with three independently controllable, magnetically orthogonal gradient field coil systems, of which here one pair of gradient coils 7, 81 for the generation of a gradient field in the Y-direction is schematically shown as an example; corresponding gradient coils exist for the generation of a gradient field in the X-direction and Z-direction. A gradient coil or a gradient coil pair is supplied with current by a gradient coil end stage 9 via two arbitrary, suitable feed lines K1, K2 (called gradient cables in the following); for example, current thus flows from the gradient coil end stage 9 via the gradient cable K1 towards the gradient coil 81 and back from the gradient coil 81 via the gradient cable K2 to the gradient coil end stage 9.

Figure 2:
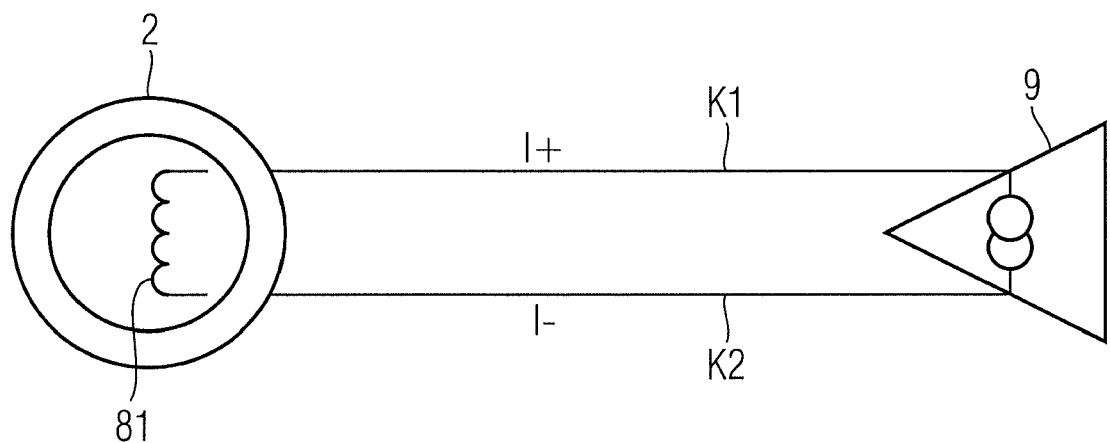
FIG. 2, schematically and with simplification, shows a gradient system for one axis.

FIG. 2 schematically and simply shows a gradient system for one axis, that includes a gradient coil 8 that is fed with current via cables K1 and K2, a gradient coil end stage 9 (here a constant power source delivering current for the gradient coil 8 and holding the current steady), and a measurement device 10 (for example a measurement conductor or a choke, etc.). As an example, here the gradient coil pair is connected in series or antiparallel for the z-direction and is mutually supplied with current via cables K1 and K2.

In order to detect a failure (such as a cable break or other defect) in a gradient cable K1 or K2 supplying a gradient coil 81 with current, here the difference of an electrical current flowing through a gradient cable K1 to the gradient coil 81 (designated here with I+) and at least one electrical current flowing away from the gradient coil 81 (designated here with I−) through a gradient cable K2 is determined, wherein a failure of a gradient cable K1 or K2 is assumed if the absolute value (U) of the difference exceeds a limit value (for example zero or a little over this, or a percentile of the current, or another value optimally predetermined via tests). Which of the two gradient cables is defective is not quite as important here; given a failure of one gradient cable, a current cutoff and/or repair is initiated, for example.

Figure 3:
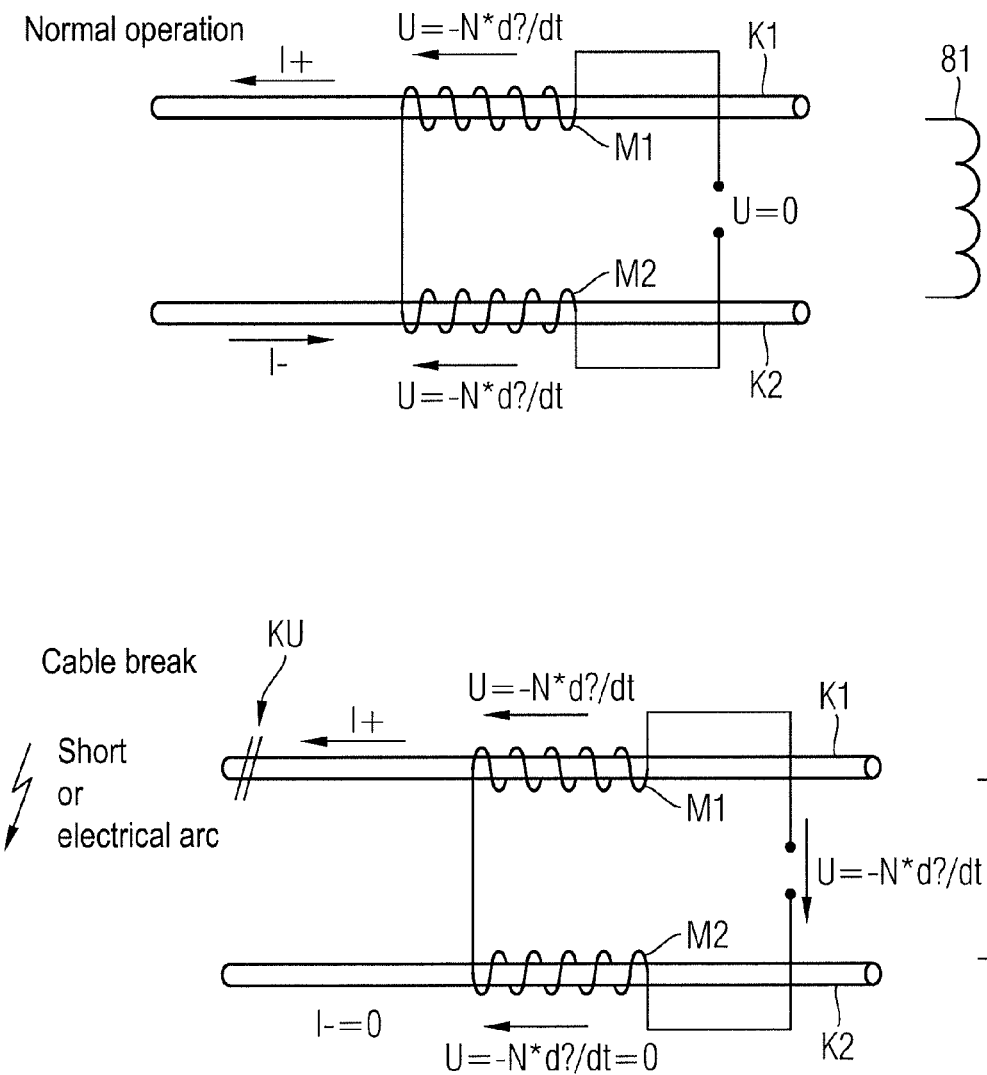
FIG. 3 schematically illustrates an error current detection with individual measurement devices at each of the gradient cables, FIG. 4 schematically illustrates error current detection with only one common current loop for two gradient cables of an axis.

FIG. 3 through 5 show variants for the determination of a failure in at least one gradient coil 81, 82, 83 of the magnetic resonance tomography system 1 with current-supplying gradient cables K1, K2 (or K1, K2, K3, K4, K5, K6).

FIG. 3 shows an error current detection with individual inductors (measurement devices) at each of the gradient cables K1, K2 (etc.) in normal operation at the top in FIG. 3 and given a cable break KU of a gradient cable K1 below in FIG. 3. The number and type of the windings of the loops M1 and M2 around the gradient cables K1, K2 are identical here. The gradient cables K1, K2 thus here together generate a field that is respectively measured by the current loops M1, M2 (as current and/or voltage induced in these); for example, if the voltage at the current loops M1, M2 connected in series is approximately zero, for example, or a voltage below a limit value is measured, it is assumed that no failure of a gradient cable is present; rather, it is assumed that a failure KU of a gradient cable (here K1) is present.

In normal operation according to the top of FIG. 3, no gradient cable is defective, the current I+ flows across the gradient cable K1 to the gradient coil 81 and the current I− flows away from the gradient coil 81 to the gradient coil end stage 9 across the gradient cable K2.

In the case of a cable break of a gradient cable K1, according to the bottom FIG. 3 the current I+ flows across the gradient cable K1 in the direction of the gradient coil 81 (and further here via an arc) and no current flows back across the gradient cable K2 from the gradient coil 81 to the gradient coil end stage 9 (I− is zero).

The difference of at least one electrical current I+ flowing towards a gradient coil 81 via a gradient cable K1 and at least one electrical current I− flowing away from a gradient coil 81 through a gradient coil K2 is determined here as a voltage U.

FIG. 4 shows a gradient cable error detection with only one common current loop M1 (measurement device) for an axis (z), thus for two gradient cables K1, K2. Here the gradient cables K1, K2—through which current flows in antiparallel—together generate a field that is measured by the current loop M1. If the voltage at the current loop M1 is approximately zero, for example, or the voltage is measured below a limit value, it is assumed that there is no failure of a gradient cable; otherwise it is assumed that a failure KU of a gradient cable K1 is present.

FIG. 5 shows an error current detection with only one common current loop (measurement device M1) for three axes (x-, y- and z-direction) with two gradient cables per axis, thus for six gradient cables K1, K2, K2, K4, K5, K6.

The difference of the sum of electrical currents (here I+, respectively; I+ is often different in the gradient coils) flowing through multiple gradient cables K1, K3, K5 to a gradient coil 81, 82, 83 and the sum of electrical currents I− (here I−, but I− is often different in the gradient coils) flowing away from a gradient coil 81, 82, 83 through multiple gradient cables K2, K4, K6 is determined, wherein a failure KB of a gradient cable is assumed only if the difference present at the current loop M1 (which is interrupted, for example) in the form of a voltage U, for example, exceeds a limit value.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for detecting failure of a gradient cable in a magnetic resonance system, comprising the steps of:
   supplying power to a gradient coil in a magnetic resonance system through multiple gradient cables connected to the gradient coil, a first of said gradient cables conducting electrical current to said gradient coil and a second of said gradient cables conducting electrical current away from said gradient coil;
   automatically detecting a difference between the current flowing to the gradient coil in said first of said gradient cables and the current flowing away from the gradient coil in the second of said gradient cables; and
   automatically providing an indication of a failure of said gradient cable when an absolute value of said difference exceeds a limit value.

2. A method as claimed in claim 1 comprising determining at least one of said electrical current flowing toward the gradient coil with a measurement device that interacts with said first of said gradient cables and the electrical current flowing from said gradient coil with a measurement device that interacts with the second of said gradient cables.

3. A method as claimed in claim 1 comprising employing as said measurement device, a conductor or a choke.

4. A method as claimed in claim 1 comprising determining the electrical current conducted toward said gradient coil and the electrical current conducted away from said gradient coil with respective measurement conductors oriented at least partially orthogonally to a direction of said gradient cable and connecting said respective measurement conductors in series with opposite polarity to cause no voltage to be produced above said limit value unless said failure of said gradient cable occurs.

5. A method as claimed in claim 1 comprising determining said difference with a measurement device connected in common to said first of said gradient cables and said second of said gradient cables.

6. A method as claimed in claim 5 comprising orienting said measurement device at least partially orthogonally to respective directions of said first of said gradient cables and said second of said gradient cables.

7. A method as claimed in claim 1 comprising conducting electrical current to said gradient coil through a first plurality of gradient cables collectively having a first sum of respective electrical currents flowing therein, and conducting current away from said gradient coil through a second plurality of gradient cables collectively having a second sum of electrical currents respectively flowing therein, and determining said difference as a difference between said first sum and said second sum.

8. A method as claimed in claim 7 comprising determining said difference using a common measurement conductor that is common to said first and second pluralities of gradient cables.

9. A method as claimed in claim 8 comprising automatically identifying said failure when a voltage at said measurement conductor exceeds a limit value.

10. A method as claimed in claim 8 comprising connecting said measurement conductor to cause no voltage above a limit value to be present at the measurement conductor unless a failure of said gradient cable occurs.

11. A method as claimed in claim 1 comprising detecting a gradient cable break as said failure.

12. A method as claimed in claim 1 comprising detecting the respective currents in said first and second of said gradient cables with a measurement device that detects respective electrical fields generated by said respective currents.

13. A gradient cable monitoring device for detecting failure of a gradient cable in a magnetic resonance system, comprising:

a gradient coil in a magnetic resonance system supplied with power through multiple gradient cables connected to the gradient coil, a first of said gradient cables conducting electrical current to said gradient coil and a second of said gradient cables conducting electrical current away from said gradient coil;

a difference detector that automatically detects a difference between the current flowing to the gradient coil in said first of said gradient cables and the current flowing away from the gradient coil in the second of said gradient cables; and an evaluation unit that automatically provides an indication of a failure of said gradient cable when an absolute value of said difference exceeds a limit value.

14. A gradient cable monitoring device as claimed in claim 13 comprising a measured device that determines at least one of said electrical current flowing toward the gradient coil with a measurement device by interacting with said first of said gradient cables and the electrical current flowing from said gradient coil by interacting with the second of said gradient cables.

15. A gradient cable monitoring device as claimed in claim 13 wherein said measurement device is a conductor or a choke.

16. A gradient cable monitoring device as claimed in claim 13 comprising respective measurement conductors that determine the electrical current conducted toward said gradient coil and the electrical current conducted away from said gradient coil, said respective measurement conductors being oriented at least partially orthogonally to a direction of said gradient cable and being connected in series with opposite polarity to cause no voltage to be produced above said limit value unless said failure of said gradient cable occurs.

17. A gradient cable monitoring device as claimed in claim 13 a measurement device that determines said difference with a measurement device being connected in common to said first of said gradient cables and said second of said gradient cables.

18. A gradient cable monitoring device as claimed in claim 17 wherein said measurement device is oriented at least partially orthogonally to respective directions of said first of said gradient cables and said second of said gradient cables.

19. A gradient cable monitoring device as claimed in claim 13 comprising a first plurality of gradient cables that conducts electrical current to said gradient coil collectively having a first sum of respective electrical currents flowing therein, and that a second plurality of gradient cables conducts current away from said gradient coil collectively having a second sum of electrical currents respectively flowing therein, and wherein said difference detector determines said difference as a difference between said first sum and said second sum.

20. A gradient cable monitoring device as claimed in claim 19 wherein said difference detector comprises a common measurement conductor that is common to said first and second pluralities of gradient cables.

21. A gradient cable monitoring device as claimed in claim 20 wherein said evaluation unit automatically identifies said failure when a voltage at said measurement conductor exceeds a limit value.

22. A gradient cable monitoring device as claimed in claim 21 wherein connecting said measurement conductor is connected to cause no voltage above a limit value to be present at the measurement conductor unless a failure of said gradient cable occurs.

23. A gradient cable monitoring device as claimed in claim 13 wherein said evaluation unit detects a gradient cable break as said failure.

24. A gradient cable monitoring device as claimed in claim 13 wherein said difference detector comprises a measurement device that detects respective electrical fields generated by said respective currents.

* * * * *